United States Patent
Hu et al.

(10) Patent No.: US 7,534,632 B2
(45) Date of Patent: May 19, 2009

(54) METHOD FOR CIRCUITS INSPECTION AND METHOD OF THE SAME

(75) Inventors: Yu-Shan Hu, Yangmei Township, Tauyuan County (TW); Dyi-Chung Hu, Hsinchu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/707,920

(22) Filed: Feb. 20, 2007

(65) Prior Publication Data

US 2008/0199391 A1 Aug. 21, 2008

(51) Int. Cl.
*G01R 31/26* (2006.01)
(52) U.S. Cl. ........................................... 438/18
(58) Field of Classification Search ................. 438/157, 438/193, 268–269, 674, 678, 783–787, 643, 438/30, 57, 627–628, 640, 99
See application file for complete search history.

(56) References Cited

U.S. PATENT DOCUMENTS

2004/0112869 A1* 6/2004 Carter et al. ................. 216/101
2005/0261152 A1* 11/2005 Carter et al. ................. 510/201

* cited by examiner

*Primary Examiner*—Charles D. Garber
*Assistant Examiner*—Andre' C Stevenson
(74) *Attorney, Agent, or Firm*—Birch, Stewart, Kolasch & Birch, LLP

(57) ABSTRACT

A method for circuit inspection comprises steps of providing a substrate having a conductive line; and forming a metal layer on at least the conductive layer to increase a contrast between the conductive layer and adjacent area for the circuit inspection. The method further comprising removing the metal layer. The metal layer is removed by a mixture of nitric acid, hydrogen peroxide and fluoride boric acid. The metal includes Silver, Nickel or Tin. The deposit metal can be removed by inter diffusion and form intermetallic compounds (for example $Cu_6Sn_5$) into the under laying conducting line.

15 Claims, 3 Drawing Sheets

Heating pure tin change to IMC

Stripping pure tin (Stripping solution : nitric acid +$H_2O_2$ + flouride boric acid)

METHOD FOR CIRCUITS INSPECTION AND METHOD OF THE SAME

TECHNICAL FIELD

The present invention relates to a method for circuit inspection, and more particularly relates to a method for circuit inspection by increasing the contrast between developing and no developing area.

BACKGROUND OF THE INVENTION

Optical inspection (AOI) systems are used for inspecting the defects of circuit; the system can be used for inspecting proper component presence and orientation, proper solder joint formation, conducting line and unwanted residue, for example photo resist residue.

As the line width of a circuit is getting narrower, it is getting easier to make mistake when doing inspection by human eye. Traditionally, to find the defect of a circuit need the experience accumulated and applying cause and effect Diagram to find out the problem; it is not only time consuming and also hard to find qualified personnel to do the job. Therefore, automated optical inspection has become popular for circuit inspection technique is the past few years.

The main automated inspection methods include inspecting by white light and by laser beams. The inspection method by white light is projecting white light on the circuit and then sensing the reflecting light signal by light sensor; at last the receiving signal is treated by the image processing software for defect identification. Another method is projecting laser beam to excite the organic fluorescence material of non metallic part and then receiving laser induced fluorescence by light sensor. By predetermined value, the metal part and non metal part of the receiving grey-scale image can be resolved; therefore the image can be used for defect inspection.

Most of the invention relates to automated optical inspection is endeavor in developing different lighting modes, signal detecting modes or other simulated methods. For example, U.S. Pat. No. 7,075,565 discloses an automated optical inspection system includes a plurality of asynchronously cameras for providing image data of a printed circuit board. The circuit board is divided into fields of view that are to be imaged in one or more cameras in one or more lighting modes. The system allows the full bandwidth of the cameras to be utilized for reducing the inspection time of the board. Taiwan Patent No. I244359 discloses a method for inspection the defect of a printed circuit board by establishing standard component templates in advance and then take these templates for defect inspection. Taiwan Patent No. I258583 discloses a lighting system for generating light with high and uniform luminescence in a small area to enhance the image resolution.

From the prior art, referring to FIG. 1, the contrast of the development and un-development area is very low. The user can not distinguish the developed area from each other. Therefore, it is unlikely to inspect the result by the operator.

Therefore, the present invention provides a method for circuit inspection, more particularly relates to a method for circuit inspection by increasing the contrast between developing and no developing area; the present method can provide a circuit image with enhanced contrast to overcome the shortcomings of prior arts.

SUMMARY OF THE INVENTION

The present invention relates to a method by enhancing the contrast of developed and undeveloped areas. The present method utilizing a chemical deposit on the conducting line to achieves the goal of present invention. Besides enhancing the contrast, the chemical can also act as conducting media; therefore, if the stripping step can't totally remove the chemical, the residue can also act as part of conducting line and would not raise the performance issue.

A method for IC inspection comprises providing a substrate having a conductive line; and forming a metal layer on at least the conductive layer to increase a contrast between the conductive layer and adjacent area for the IC inspection. The method further comprising removing the metal layer. The metal layer is removed by a mixture of nitric acid, hydrogen peroxide and fluoride boric acid. The metal includes Silver, Nickel or Tin. The deposit metal can be removed by inter diffusion and form intermetallic compound (for example $Cu_6Sn_5$ if the under laying conducting line is copper) into the under laying conducting line.

Alternatively, the method for circuit inspection comprises a step of providing a substrate having a conductive line; and forming a metal layer on at least the conductive layer to increase a contrast between the developed area and un-developed area for the circuit inspection. The method further comprises removing the metal layer. The metal layer is removed by a mixture of nitric acid, hydrogen peroxide and fluoride boric acid. The metal includes Silver, Nickel or Tin. The deposit metal can be removed by inter diffusion and form intermetallic compound (for example $Cu_6Sn_5$) into the under laying conducting line.

A method for residual photoresist inspection comprises a step of providing a substrate having an inspection area; and forming a metal layer on at least the substrate to increase a contrast between the residual photoresist and adjacent area for inspection.

BRIEF DESCRIPTION OF THE DRAWINGS

The above objects, and other features and advantages of the present invention will become more apparent after reading the following detailed description when taken in conjunction with the drawings, in which.

DETAILED DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide clearer description and comprehension of the present invention.

Figure 1:
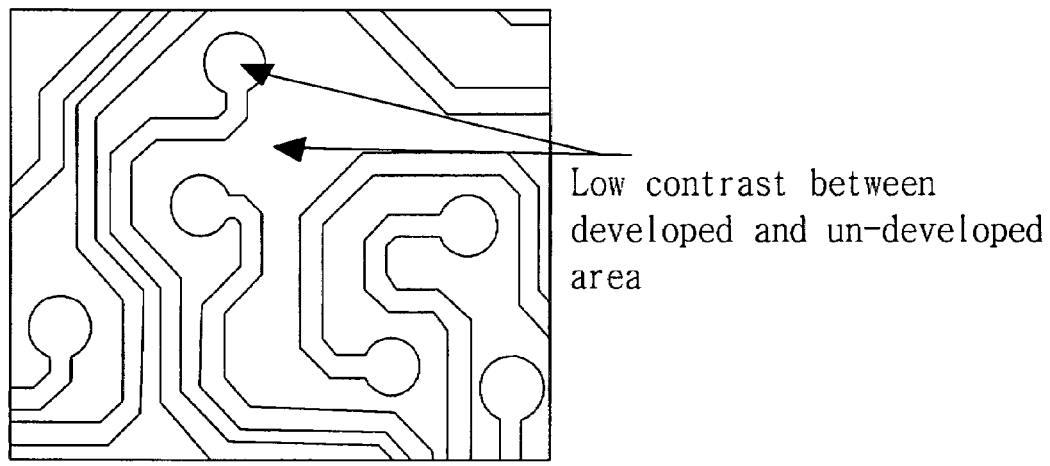
FIG. 1 is a schematic diagram of the inspection method according to the present invention.
Figure 2:
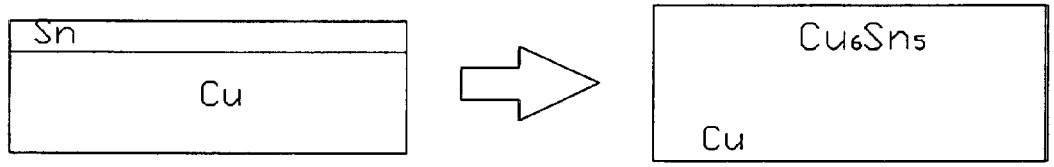
FIG. 2 is a schematic diagram of the inspection method according to the present invention.
Figure 2:
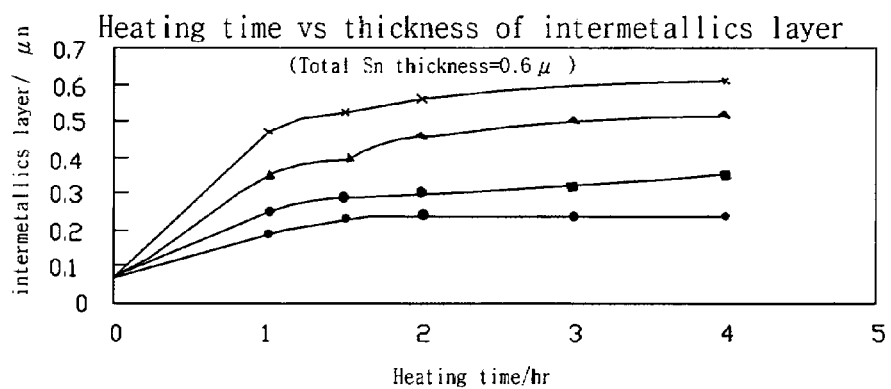
Figure 2:
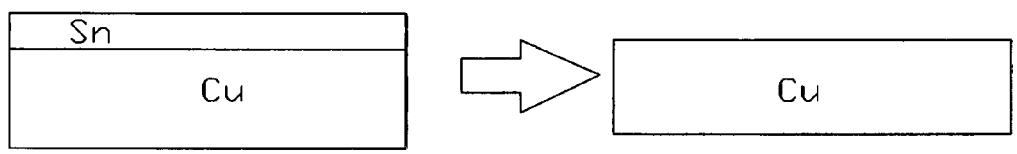

The present invention relates to a method for enhancing the contrast of a developed and un-developed areas. The present invention includes a step of forming a metal on a conductive line to increase the contrast between the conductive line and other area. The metal could be Immersion Tin, Immersion Silver or Electroless Nickel. Take Tin as an example, referring to FIG. 2, Tin is deposited on a conducting line, for example made of copper (Cu) to increase the contrast. A layer of intermetallic compound $Cu_6Sn_5$ forms between the Cu and Sn layers due to the materials solid-state diffusion. FIG. 2 also illustrates heating time versus thickness of intermetallic layer, as the controlled maximum deposition thickness of Sn is 0.6 µm, the thickness of intermetallic layer is increased with heating time and the thickness stabilized after 4 hours. Optionally, after finishing inspection, Sn deposition can be stripped by chemical reaction, for example, utilizing the mixture of nitric acid, hydrogen peroxide and fluoride boric acid for stripping the Sn deposition. On the contrary, this layer can be remained on the conductive layer.

Figure 3:
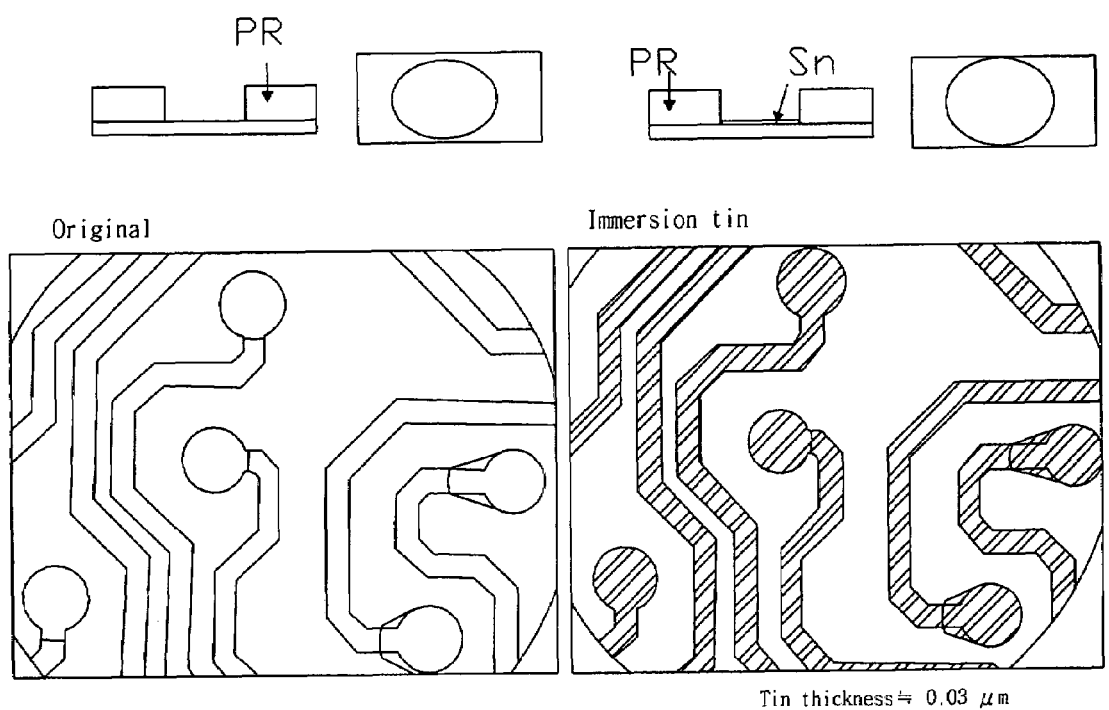
FIG. 3 is a schematic diagram of the result of the inspection method according to the present invention.

FIG. 3 illustrates the OM inspection picture before and after Sn deposits on the inspection area. The upper portion is the cross-section and top views, and the pictures are the top views of the inspection area. We can easily identify that after immersed Sn deposits on the inspection area, the contrast is enhanced from the illustration.

Figure 4:
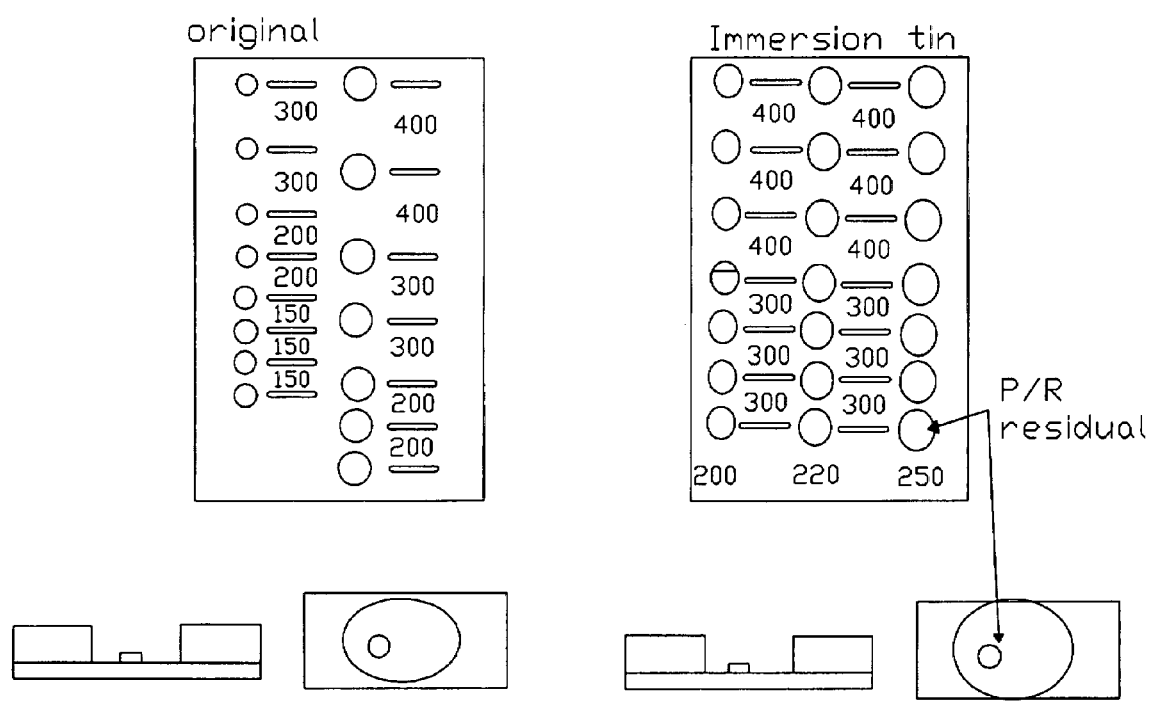
FIG. 4 is a schematic diagram of the result of the inspection method according to the present invention.

Because Sn fails to deposit on top of the photo resist, therefore the immersion Sn can also be utilized for find out the unwanted residual photo resist. FIG. 4 is another OM inspection picture before and after Sn deposits on the inspection area. Left side is the original method, the contrast is very low, and the right side is the present invention. After immersion Sn is formed, it is observed that Sn would not deposit on the residual photo resist and the unwanted photo resist residual can be easily identified.

Although specific embodiments have been illustrated and described, it will be obvious to those skilled in the art that various modifications may be made without departing from what is intended to be limited solely by the appended claims.

What is claimed is:

1. A method for circuit inspection, comprising:
   providing a substrate having a conductive line and a photoresist layer;
   after the photoresist layer is formed and before the photoresist layer is removed, forming a contrast metal layer on at least said conductive line without forming the contrast metal layer on top of the photoresist layer to increase a contrast betwcen said conductive line and adjacent area for said circuit inspection.

2. The method in claim 1, further comprising removing said contrast metal layer.

3. The method in claim 2, wherein said contrast metal layer is removed by a mixture of nitric acid, hydrogen peroxide and fluoride boric acid.

4. The method in claim 1, wherein said contrast metal layer includes Silver, Nickel or Tin.

5. The method in claim 1, wherein said contrast metal layer is removed by inter diffusion to form an intermetallic compound into said conductive line.

6. A method for circuit inspection, comprising: providing a substrate having a conductive line and a photoresist layer;
   after the photoresist layer is formed and before the photoresist layer is removed, forming a contrast metal layer on at least said conductive line without forming the contrast metal layer on top of the photoresist layer to increase a contrast between development area and un-development area for said circuit inspection.

7. The method in claim 6, further comprising removing said contrast metal layer.

8. The method in claim 7, wherein said contrast metal layer is removed by a mixture of nitric acid, hydrogen peroxide and fluoride boric acid.

9. The method in claim 6, wherein said contrast metal layer includes Silver, Nickel or Tin.

10. The method in claim 6, wherein said contrast metal layer is removed by inter diffusion to form an intermetallic compound into said conductive line.

11. A method for residual photoresist inspection, comprising:
    providing a substrate having an inspection area and a photoresist layer:
    after the photoresist layer is formed and before the photoresist layer is removed, forming a contrast metal layer on at least said substrate without forming the contrast metal layer on top of the photoresist layer to increase a contrast bctween a residual photoresist and adjacent area for inspection.

12. The method in claim 11, fwTher comprising removing said contrast metal layer.

13. The method in claim 12, wherein said contrast metal layer is removed by a mixture of nitric acid, hydrogen peroxide and fluoride boric acid.

14. The method in claim 11, wherein said contrast metal includes Silver, Nickel or Tin.

15. The method in claim 11, wherein said contrast metal layer is removed by inter diffusion and form intermetallic compound into said conductive line.

* * * * *